United States Patent
Huska

(10) Patent No.: US 11,282,730 B2
(45) Date of Patent: Mar. 22, 2022

(54) BRIDGE APPARATUS FOR SEMICONDUCTOR DIE TRANSFER

(71) Applicant: Rohinni, LLC, Coeur d'Alene, ID (US)

(72) Inventor: Andrew Huska, Liberty Lake, WA (US)

(73) Assignee: Rohinni, LLC, Coeur d'Alene, ID (US)

( * ) Notice: Subject to any disclaimer, the term of this patent is extended or adjusted under 35 U.S.C. 154(b) by 175 days.

(21) Appl. No.: 16/530,886

(22) Filed: Aug. 2, 2019

(65) Prior Publication Data

US 2021/0035837 A1  Feb. 4, 2021

(51) Int. Cl.
| | | |
|---|---|---|
| *H01L 21/677* | (2006.01) | |
| *H01L 21/683* | (2006.01) | |
| *H01L 21/68* | (2006.01) | |

(52) U.S. Cl.
CPC .. *H01L 21/67715* (2013.01); *H01L 21/67706* (2013.01); *H01L 21/681* (2013.01); *H01L 21/6836* (2013.01)

(58) Field of Classification Search
CPC ......... H01L 21/67144; H01L 21/67706; H01L 21/67715; H01L 21/681; H01L 21/6836; H01L 2223/5442; H01L 2223/54426; H01L 2223/54433; H01L 2223/54486; H01L 23/544
See application file for complete search history.

(56) References Cited

U.S. PATENT DOCUMENTS

| | | | | |
|---|---|---|---|---|
| 4,631,812 A | * | 12/1986 | Young | B25J 15/0206 198/586 |
| 6,802,118 B1 | * | 10/2004 | Yi | H05K 13/046 29/832 |
| 7,836,582 B2 | * | 11/2010 | Gieskes | H05K 13/0061 29/739 |
| 10,410,905 B1 | * | 9/2019 | Peterson | H01L 24/75 |
| 2006/0290369 A1 | * | 12/2006 | Yamashita | G01R 31/2886 324/750.2 |
| 2010/0075459 A1 | | 3/2010 | Kerr et al. | |
| 2016/0276205 A1 | | 9/2016 | Huska et al. | |
| 2018/0144958 A1 | | 5/2018 | Peterson et al. | |
| 2018/0233495 A1 | | 8/2018 | Peterson et al. | |

FOREIGN PATENT DOCUMENTS

WO   WO2018136645 A1   7/2018

OTHER PUBLICATIONS

The PCT Search Report and Written Opinion dated Sep. 24, 2020 for PCT application No. PCT/US20/41832, 7 pages.

* cited by examiner

*Primary Examiner* — Minh N Trinh
(74) *Attorney, Agent, or Firm* — Lee & Hayes, P.C.

(57) ABSTRACT

An apparatus for transferring a semiconductor die ("die") from the first substrate to the second substrate. The apparatus includes a stage configured to hold a product substrate. A first bridge holds a transfer mechanism assembly. A second bridge holds a die substrate holder configured to hold the first substrate. A controller is configured to cause the first bridge and the second bridge to move to align the transfer mechanism assembly with the die on the first substrate with a transfer position on the second substrate where the die is to be transferred.

8 Claims, 9 Drawing Sheets

BRIDGE APPARATUS FOR SEMICONDUCTOR DIE TRANSFER

BACKGROUND

Semiconductor devices are electrical components that utilize semiconductor material, such as silicon, germanium, gallium arsenide, and the like. Semiconductor devices are typically manufactured as single discrete devices or as integrated circuits (ICs). Examples of single discrete devices include electrically-actuatable elements such as light-emitting diodes (LEDs), diodes, transistors, resistors, capacitors, fuses, and the like.

The fabrication of semiconductor devices typically involves an intricate manufacturing process with a myriad of steps. The end-product of the fabrication is a "packaged" semiconductor device. The "packaged" modifier refers to the enclosure and protective features built into the final product as well as the interface that enables the device in the package to be incorporated into an ultimate circuit.

The conventional fabrication process for semiconductor devices starts with handling a semiconductor wafer. The wafer is diced into a multitude of "unpackaged" semiconductor devices. The "unpackaged" modifier refers to an unenclosed semiconductor device without protective features. Herein, unpackaged semiconductor devices may be called semiconductor device die, or just "die" for simplicity. A single semiconductor wafer may be diced to create die of various sizes, so as to form upwards of more than 100,000 or even 1,000,000 die from the semiconductor wafer (depending on the starting size of the semiconductor), and each die has a certain quality. The unpackaged die are then "packaged" via a conventional fabrication process discussed briefly below. The actions between the wafer handling and the packaging may be referred to as "die preparation."

In some instances, the die preparation may include sorting the die via a "pick and place process," whereby diced die are picked up individually and sorted into bins. The sorting may be based on the forward voltage capacity of the die, the average power of the die, and/or the wavelength of the die.

Typically, the packaging involves mounting a die into a plastic or ceramic package (e.g., mold or enclosure). The packaging also includes connecting the die contacts to pins/wires for interfacing/interconnecting with ultimate circuitry. The packaging of the semiconductor device is typically completed by sealing the die to protect it from the environment (e.g., dust).

A product manufacturer then places packaged semiconductor devices in product circuitry. Due to the packaging, the devices are ready to be "plugged in" to the circuit assembly of the product being manufactured. Additionally, while the packaging of the devices protects them from elements that might degrade or destroy the devices, the packaged devices are inherently larger (e.g., in some cases, around 10 times the thickness and 10 times the area, resulting in 100 times the volume) than the die found inside the package. Thus, the resulting circuit assembly cannot be any thinner than the packaging of the semiconductor devices.

BRIEF DESCRIPTION OF THE DRAWINGS

The Detailed Description is set forth with reference to the accompanying figures. In the figures, the left-most digit(s) of a reference number identifies the figure in which the reference number first appears. The use of the same reference numbers in different figures indicates similar or identical items. Furthermore, the drawings may be considered as providing an approximate depiction of the relative sizes of the individual components within individual figures. However, the drawings are not to scale, and the relative sizes of the individual components, both within individual figures and between the different figures, may vary from what is depicted. In particular, some of the figures may depict components as a certain size or shape, while other figures may depict the same components on a larger scale or differently shaped for the sake of clarity.

DETAILED DESCRIPTION

Figure 1:
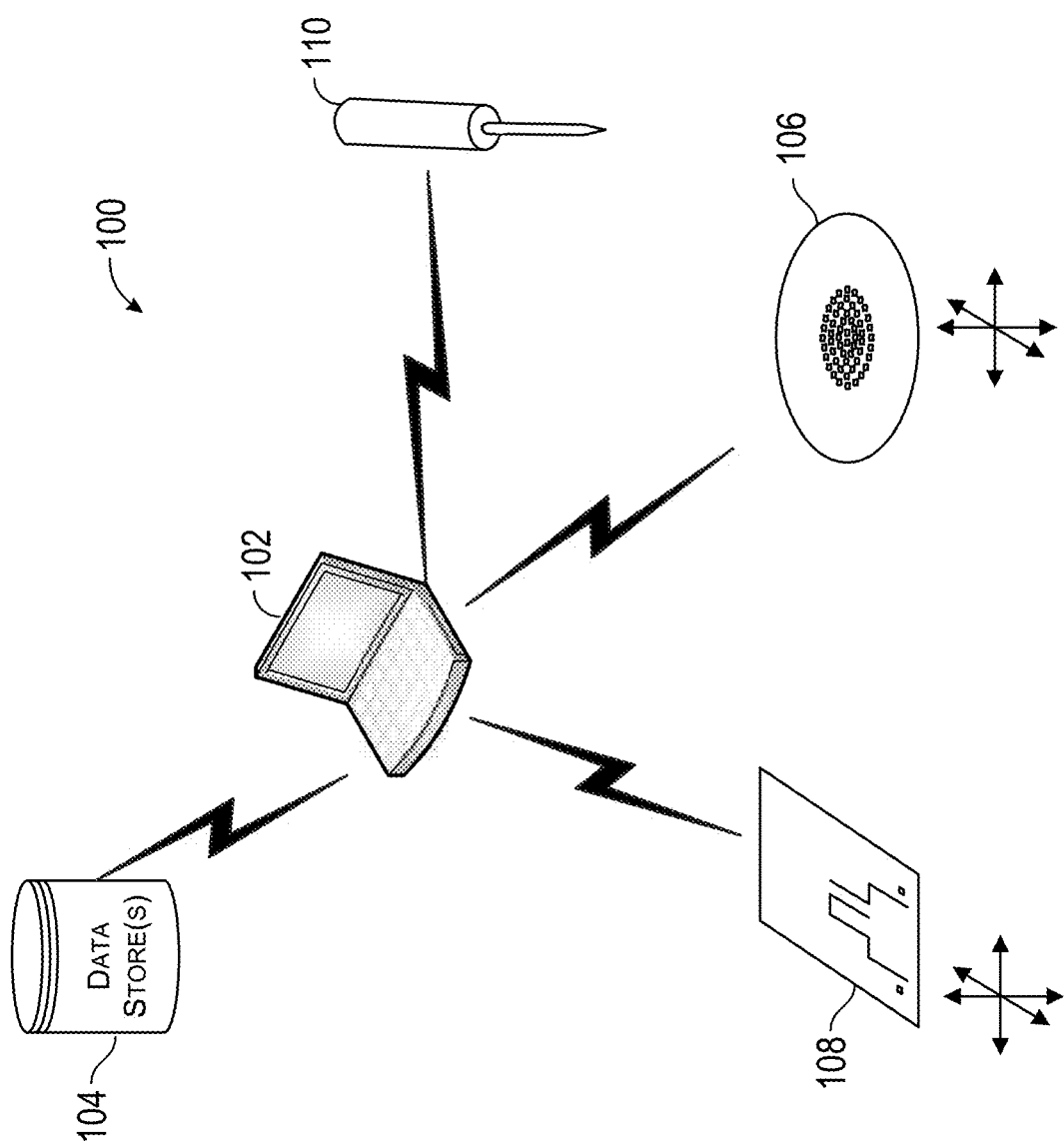
FIG. 1 illustrates a schematic view of an embodiment of elements of a die transfer system.

This disclosure is directed to a machine that directly transfers and affixes semiconductor device die to a circuit and to the process for achieving the same, as well as to the circuit having die affixed thereto (as the output product). In an embodiment, the machine functions to transfer unpackaged die directly from a substrate such as a "wafer tape" to a product substrate, such as a circuit substrate. The direct transfer of unpackaged die may significantly reduce the thickness of an end product compared to a similar product produced by conventional means, as well as the amount of time and/or cost to manufacture the product substrate.

For the purpose of this description, the term "substrate" refers to any substance on which, or to which, a process or action occurs. Further, the term "product" refers to the desired output from a process or action, regardless of the state of completion. Thus, a product substrate refers to any substance on which, or to which, a process or action is caused to occur for a desired output. Herein, the term "product substrate" may include, but is not limited to: a wafer tape (for example, to presort the die and create sorted die sheets for future use); a paper or polymer substrate formed as a sheet or other non-planar shape, where the polymer—translucent or otherwise—may be selected from any suitable polymers, including, but not limited to, a silicone, an acrylic, a polyester, a polycarbonate, etc.; a circuit board (such as a printed circuit board (PCB)); a string or thread circuit, which may include a pair of conductive wires or "threads" extending in parallel; and a cloth material of cotton, nylon, rayon, leather, etc. The choice of material of the product substrate may include durable materials, flexible materials, rigid materials, and other materials with which the transfer process is successful and which maintain suitability for the end use of the product substrate. The product substrate may be formed solely or at least partially of conductive material such that the product substrate acts as a conductive circuit for forming a product. The potential types of product substrate may further include items, such as glass bottles, vehicle windows, or sheets of glass.

In an embodiment, the product substrate may include a circuit trace disposed thereon. The circuit trace, as depicted, may include a pair of adjacent trace lines spaced apart by a trace spacing, or gap so as to accommodate a distance between electrical contact terminals (not shown) on the die being transferred. Thus, the trace spacing, or gap between the adjacent trace lines of the circuit trace may be sized according to the size of the die being transferred to ensure proper connectivity and subsequent activation of the die. For example, the circuit trace may have a trace spacing, or gap ranging from about 10 to 200 microns, about 100 to 175 microns, or about 125 to 150 microns.

The circuit trace may be formed from a conductive ink disposed via screen printing, inkjet printing, laser printing, manual printing, or other printing means. Further, the circuit trace may be pre-cured and semi-dry or dry to provide additional stability, while still being activatable for die conductivity purposes. A wet conductive ink may also be used to form the circuit trace, or a combination of wet and dry ink may be used for the circuit trace. Alternatively, or additionally, the circuit trace may be pre-formed as a wire trace, or photo-etched, or from molten material formed into a circuit pattern and subsequently adhered, embedded, or otherwise secured to the product substrate.

The material of the circuit trace may include, but is not limited to, silver, copper, gold, carbon, conductive polymers, etc. In an embodiment, the circuit trace may include a silver-coated copper particle. A thickness of the circuit trace may vary depending on the type of material used, the intended function and appropriate strength or flexibility to achieve that function, the energy capacity, the size of the LED, etc. For example, a thickness of the circuit trace may range from about 5 microns to 20 microns, from about 7 microns to 15 microns, or from about 10 microns to 12 microns.

Accordingly, in one non-limiting example, the product substrate may be a flexible, translucent polyester sheet having a desired circuit pattern screen printed thereon using a silver-based conductive ink material to form the circuit trace.

In an embodiment, the machine may secure a product substrate for receiving "unpackaged" die, such as LEDs, transferred from the wafer tape, for example. In an effort to reduce the dimensions of the products using the die, the die may be very small and thin. For example, a die may be about 50 microns thick. In other cases, the die may be under 30 microns thick. It should, however, be noted that the systems and methods, as disclosed herein, may be applied to die thicknesses greater than 50 microns, such as 200 microns thickness or greater. Due to the relatively small size of the die, the machine includes components that function to precisely align both the wafer tape carrying the die and transfer mechanism with the transfer location on the product substrate to ensure accurate placement and/or avoid product material waste. In an embodiment, the components that align the transfer mechanism and the die on the wafer tape may include a set of bridges to which the wafer tape and the transfer mechanism are secured respectively and conveyed individually to a position of alignment such that a specific die on the wafer tape is transferred to a specific spot on the product substrate.

In an embodiment, the machine further includes a transfer mechanism for transferring the die directly from the wafer tape to the product substrate without "packaging" the die. The transfer mechanism may be disposed vertically above the wafer tape so as to press down on the die via the wafer tape toward the product substrate. This process of pressing down on the die may cause the die to peel off of the wafer tape, starting at the sides of the die until the die separate from the wafer tape to be attached to the product substrate. That is, by reducing the adhesion force between the die and the wafer tape and increasing the adhesion force between the die and the product substrate, the die may be transferred.

In an embodiment, the transfer mechanism may include an elongated rod, such as a pin or needle that may be cyclically actuated against the wafer tape to push the wafer tape from a top side. The needle may be sized so as to be no wider than a width of the die being transferred. Although in other instances, the width of the needle may be wider, or any other dimension. When the end of the needle contacts the wafer tape, the wafer tape may experience a local deflection at the area between the die and the wafer tape. Inasmuch as the deflection is highly localized and rapidly performed, the portion of the wafer tape that does not receive pressure from the needle may begin to flex away from the surface of the die. This partial separation may thus cause the die to lose sufficient contact with the wafer tape, so as to be released from the wafer tape. Moreover, in an embodiment, the deflection of the wafer tape may be so minimal, as to maintain an entirety of the surface area of the die in contact with the wafer tape, while still causing the opposing surface of the die to extend beyond a plane of extension of the corresponding surface of the adjacent die to avoid unintentional transfer of the adjacent die.

In an embodiment, the transfer apparatus may include one or more bridge structures that hold a frame carrying the die substrate and the transfer mechanism assembly. Similar to other embodiments described herein, the die substrate may be wafer tape with semiconductor die attached thereto. The transfer mechanism assembly may include a pin actuator that is configured to actuate a pin that, when aligned, presses a die from the die substrate onto the product substrate. In some cases, the product substrate may be disposed on a stage that is configured to translate the product substrate in a first direction. The one or more bridge structures may also be configured to move, and therefore, move the die substrate and/or the transfer mechanism assembly in substantially the same first direction. In other words, the stage on which the product substrate sits may be movably disposed in the transfer apparatus and may be configured to move either manually and/or via computer-controlled motor(s). Similarly, the one or more bridge structures may be movably mounted on a set of rails of the transfer apparatus and may also be configured to move via computer-controlled motor(s).

Each of the bridges may have a rail or a track disposed thereon that extends substantially perpendicular to the set of rails on which the bridge structure is mounted. The transfer mechanism assembly and the frame carrying the die substrate may be mounted to a same bridge or each to a distinct bridge via the aforementioned rail or track, such that the frame carrying the die substrate and/or the transfer mechanism assembly are movable in a second direction that is substantially perpendicular to the first direction in which the bridge structure is movable. In this way, the bridge structures may be moved in a first direction independently of the movement of the frame carrying the die substrate and/or the transfer mechanism assembly in the second direction.

The one or more bridge structures, the frame carrying the die substrate, the transfer mechanism assembly, and/or the product substrate may be moved via computer-controlled motors, so that the transfer mechanism assembly is aligned with the next die to be transferred on the die substrate and the next transfer position on the product substrate. At this point, the pin of the transfer mechanism assembly may be actuated to apply pressure to the die substrate, on the backside of the next die to be transferred, to bring the die in contact with and transfer to the product substrate at the position where the die is to be placed on the product substrate. This process may be repeated until all of the die to be transferred onto the product substrate have been transferred from the die substrate (e.g., wafer tape) to the product substrate.

In an embodiment, the transfer apparatus may have a first bridge and second bridge ("bridges"). Both the first bridge and the second bridge may be movable in a first direction (e.g., along a length or width of the product substrate) along a first rail and a second rail ("rails"), where the first rail and the second rail may be disposed on opposite sides, respectively, of a stage configured to hold the product substrate. Although for the purposes of this description the term "rail" is being used, it should be understood that any suitable guide for movement of the bridges in substantially a single direction (e.g., along the first direction, but not directions with orthogonal components to the first direction) is contemplated according to an embodiment. The bridges may have one or more motor(s) disposed thereon, respectively, to move the bridges along the rails. Alternatively, the bridges may be mechanically coupled to one or more motor(s), such as by way of cable, chain, and/or pulley, to enable movement along the rails.

The first bridge may include two leg portions that engage with the first and second rails, respectively, and a bridge portion that connects between the two leg portions. The bridge portion spans over the stage and/or the product substrate provided on the stage. The bridge portion of the first bridge may have a track or guide disposed along a portion of its length. This track may extend along the bridge portion in a direction substantially perpendicular to the first and second rails to which the first bridge may be movably mounted. The transfer mechanism assembly may be disposed movably along this track. The transfer mechanism assembly may be mechanically coupled to one or more computer-controlled motors, to move the transfer mechanism assembly along the track of the first bridge. In an embodiment, the transfer mechanism assembly may be disposed on the track such that the transfer mechanism assembly may be configured to move the full distance across (e.g., width) of the stage and/or the product substrate disposed on the stage.

Similar to the first bridge, the second bridge may also include two leg portions that engage with the first and second rails, respectively, and a bridge portion that connects between the two leg portions. The bridge portion spans over the stage and/or the product substrate provided on the stage. The bridge portion of the second bridge may also have a track or guide disposed along a portion of its length. This track may extend along the bridge portion in a direction substantially perpendicular to the first and second rails to which the second bridge may be movably mounted. The die substrate, as mounted on a frame or holder, may be disposed movably along this track of the second bridge. The die substrate may be mechanically coupled to one or more computer-controlled motors, to move the die substrate, as mounted on the die substrate frame, along the track of the second bridge. In an embodiment, the die substrate frame may be disposed on the track such that the die substrate may be configured to move the full distance across (e.g., width) of the stage and/or the product substrate disposed on the stage.

The two bridges, as well as the stage, the transfer mechanism assembly, and the die substrate may be moved via a controller to align a die on the die substrate to be transferred with a pin of the transfer mechanism assembly with a location on the product substrate where the die is to be placed. After this alignment, the pin of the transfer mechanism assembly may be actuated to push the die in contact with the product substrate (or the circuit trace on the product substrate, when appropriate) to transfer the die onto the product substrate.

According to an embodiment, a transfer apparatus may include more than one transfer mechanism assembly and more than one die substrate on each of the two bridge structures. This may allow for parallel processing (e.g., small movement of components followed by die transfer) of die being transferred to the product substrate. A transfer apparatus with multiple transfer mechanism assemblies and multiple corresponding die substrates may allow for assembly with different types of die. For example, a micro-sized LED of a particular color may be transferred from a first die substrate, while a micro-sized LED of a different color may be transferred from another die substrate. In another example, a lens or an electrically actuatable element (i.e., capacitor, transistor, controller, etc.) may be transferred from a first substrate, while an LED of any size or color may be transferred from a second substrate.

In an embodiment, a transfer apparatus may include less than or more than two bridge structures (e.g., one, three, four, five, etc.). For example, four bridge structures may be implemented where two sets of two bridge structures may be configured to operate in parallel to increase the throughput of product substrates output by the transfer apparatus. As described above, using multiple sets of transfer mechanism assemblies and die substrate holders may also enable diversity by transferring one type of lens or other electrically actuatable element from one set of bridge structures and transferring another type of lens or other electrically actuatable element from another set of bridge structures. It should additionally be understood that in any embodiment, a single bridge structure may implement both a transfer mechanism assembly and a die substrate holder, or where at least two bridge structures are implemented, the one or more transfer mechanism assemblies and the one or more die substrate holders may be distributed on adjacent bridge structures, respectively, of the transfer apparatus (i.e., a transfer mechanism assembly on a first bridge working with a die substrate holder on the adjacent bridge) such that the bridge structures move together to transfer die.

In an embodiment, one or more sensors may be implemented to assist the transfer apparatus in determining the precise transfer location and alignment of the components involved in the transfer. Further, a die map may be used to help guide the apparatus to determine which die on a given die substrate should be transferred according to the die quality or other die factors. Sensors and a die map may be implemented similarly as is discussed in U.S. Pat. No. 9,633,883.

Die transfer rates using a transfer apparatus as described herein, in conjunction with multiple transfer mechanisms, as discussed in U.S. application Ser. No. 15/978,094, may permit for a significantly higher transfer rate than is available in the conventional machines. The die transfer rate is the number of die that are transferred per second by the apparatus, which rate may range from about 5-500 die, 50-400 die, 100-300 die, or 150-250 die, for example, placed per second A simplified example of an embodiment of a direct transfer system 100 is illustrated in FIG. 1. The transfer system 100 may include a personal computer (PC) 102 (or server, data input device, user interface, etc.), a data store 104, a wafer tape mechanism 106, a product substrate mechanism 108, and a transfer mechanism 110. Inasmuch as a more detailed description of the wafer tape mechanism 106, the product substrate mechanism 108, the transfer mechanism 110, has been given heretofore, specific details about these mechanisms is not repeated here. However, a brief description of how the wafer tape mechanism 106, the product substrate mechanism 108, the transfer mechanism 110, relate to interactions between the PC 102 and the data store 104 is described hereafter.

In an embodiment, the PC 102 communicates with data store 104 to receive information and data useful in the transfer process of directly transferring die from a wafer tape in wafer tape mechanism 106 using the transfer mechanism 110 on to a product substrate in the product substrate mechanism 108 whereat the die may be attached to the product substrate. PC 102 may also serve as a receiver, compiler, organizer, and controller of data being relayed to and from each of the wafer tape mechanism 106, the product substrate mechanism 108, and the transfer mechanism 110. PC 102 may further receive directed information from a user of the transfer system 100. Note that, while FIG. 1 depicts directional movement capability arrows adjacent to the wafer tape mechanism 106 and the product substrate mechanism 108, those arrows merely indicate general directions for mobility, however, it is contemplated that both the wafer tape mechanism 106 and the product substrate mechanism 108 may also be configurable to move in other directions including rotation in plane, pitch, roll, and yaw, for example.

Figure 2:
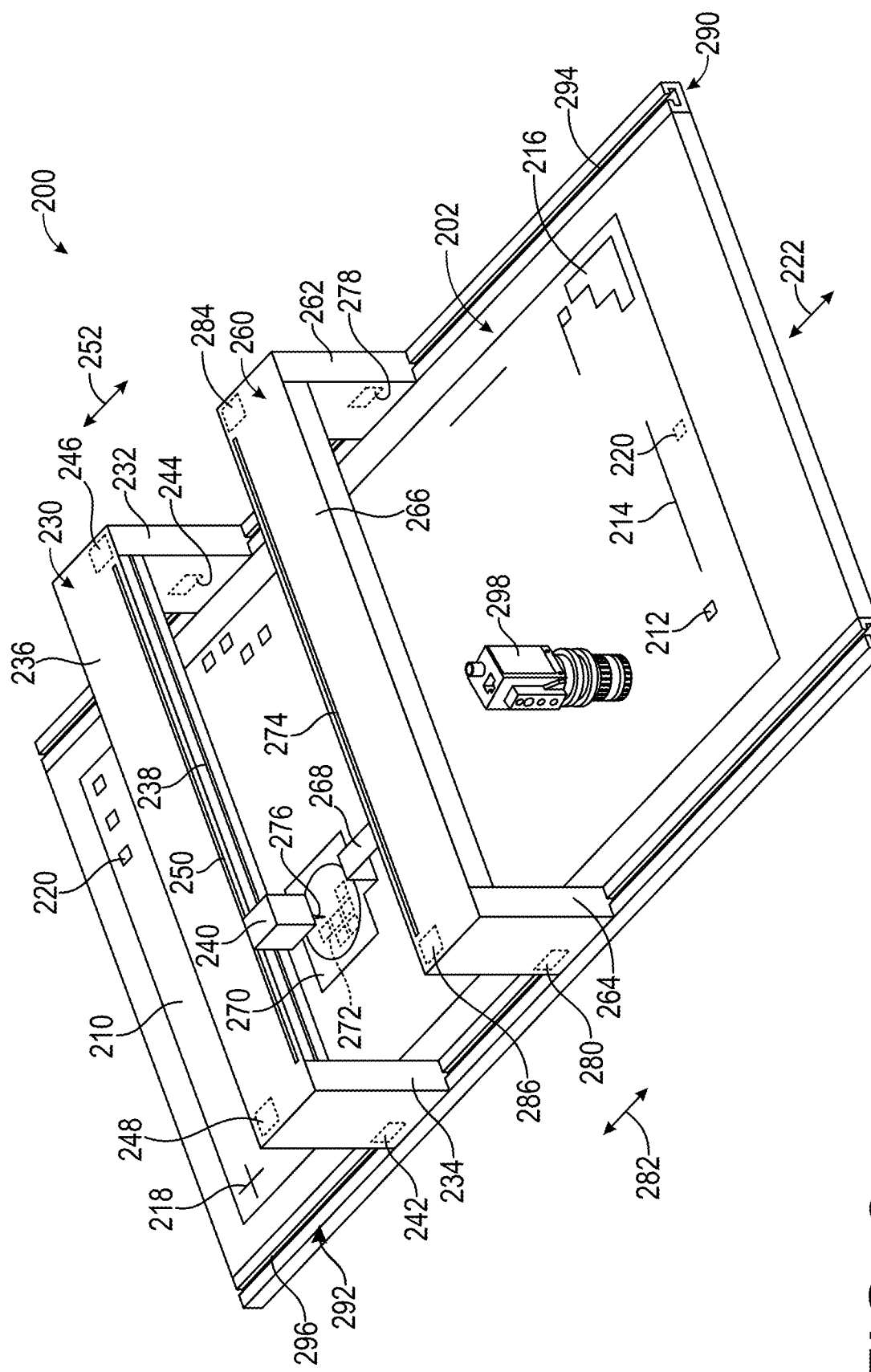
FIG. 2 illustrates a schematic view of an example transfer apparatus with a bridge apparatus for transfer of die from a die substrate to a product substrate according to an embodiment of this application.

FIG. 2 illustrates a schematic view of an example transfer apparatus 200 with bridge apparatuses 230, 260 for transfer of die 272 from a die substrate 270 to a product substrate 210. The transfer apparatus 200 may include a movable stage 202 configured to hold the product substrate 210. The movable stage 202 may be configured to move in one or more directions (e.g., x-direction, y-direction, or both x and y-direction). In an embodiment, the movable stage 202 may also be configured to move up and down (e.g., in the z-direction). For example, the movable stage 202 may be configured, such as by coupling to a motor or other mechanical device, to move in direction 222.

The product substrate 210 may be any suitable material (e.g., PCB, FR-4 board, paper, cardboard, glass, ceramic, plastic, tape, etc.), as described herein. The product substrate 210 may have previously transferred die 212, such as semiconductor die, and/or circuit traces 214 disposed and/or formed thereon and/or therein. The die 212, in an embodiment, may be disposed on the product substrate 210 according to the methods and apparatus as described herein. The circuit traces 214 may be of any suitable type and/or areal density. These circuit traces 214 may be conductive and configured to carry current, such as between a die 212 and one or more other elements of the product substrate 210.

The product substrate 210 may further include alignment features 216, 218 of any suitable type, such as a tree structure 216 or a cross 218. The alignment features 216, 218 may have known coordinates for a particular product substrate 210 that may be known to a controller, such as PC 102. The alignment features 216, 218, along with their known coordinates, may be used by the PC 102 to determine positions of various components of the transfer apparatus 200. Thus, the alignment structures 216, 218 may be detected, such as by optical imaging, and used for aligning and/or orienting components of the transfer apparatus 200 to transfer die 272 onto the product substrate 210. The product substrate 210 may further have positions and/or locations 220 where die are to be transferred. In some cases, the position 220 where die are to be transferred may be visually identifiable and may be identified by optical detection. Such visual indicia of the positions 220 where die are to be transferred may also be used to align components of the transfer apparatus 200 to transfer die 272 onto the product substrate 210. The PC 102 may receive information about the product substrate 210, such as die transfer positions 220 and/or alignment features 216, 218, in the form of a product substrate data file.

The transfer apparatus 200 may further include a first bridge structure 230 and a second bridge structure 260. The first bridge structure 230 may have a first leg 232, a second leg 234, and a bridge portion 236 disposed between the first leg 232 and the second leg 234. The first bridge structure 230 may be configured to move along a first rail 290 and a second rail 292. The legs 232, 234 may be movably coupled to the rails 290, 292 allowing the first bridge structure 230 to move along the first rail 290 and second rail 292.

The first bridge structure 230 may have a rail and/or track 238 disposed along its bridge portion 236. A transfer mechanism assembly 240, as described herein, may be movably mounted on the track 238. The track 238, and therefore, the range of positions of the transfer mechanism assembly 240 may be the same or greater than a width of the product substrate 210 to enable transfer of die 272 onto any suitable location on the product substrate 210. The transfer mechanism assembly 240 may have a pin 276 that can be actuated to extend outward from the transfer mechanism assembly 240 and retracted inward toward the transfer mechanism assembly 240, as described herein.

The first bridge structure 230 may further include one or more motors 242, 244, 246, 248 to enable the first bridge structure 230 to move along the rails 290, 292 and to enable the transfer mechanism assembly 240 to move along track 238. The motor 242 may be encased within the second leg 234, such as within a housing of the second leg 234, and the motor 244 may be encased within the first leg 234. The motors 242, 244 may be computer controlled, such as by PC 102, to exert force on the legs 232, 234 relative to the rails 290, 292 to move the first bridge structure along the rails 290, 292 along the direction 252. The direction 252 may be the same direction as direction 222 along which the movable stage 202 may be configured to move.

Although the motors are depicted as disposed on the legs 232, 234, it should be understood that any suitable coupling of the motors 242, 244 with the legs 232, 234 may be implemented to move the first bridge structure 230 along the rails 290, 292. For example, there may be more than one motor 242, 244 per leg 232, 234 of the first bridge structure 230. Additionally, in an embodiment, the motors 242, 244 may be located outside of the legs 232, 234 and coupled to each of the legs, respectively, via wire, cable, pulleys, etc.

The motors 246, 248 are coupled with transfer apparatus 200 to move the transfer mechanism assembly 240. For example, motors 246, 248 may be disposed in and/or on the bridge portion 236 of the first bridge structure 230. The transfer mechanism assembly 240 may be mechanically coupled to the motors 246, 248 by wire, cable, pulleys, etc. (not shown). The motors 246, 248 may be controlled by PC 102 to move the transfer mechanism assembly 240 along the length of the track 238. The first bridge structure 230 may further include one or more sensors 250, such as a linear sensor, for example. The sensor 250 may be configured to provide signals indicative of the position of the transfer mechanism assembly 240 along the track 238 of the first bridge structure 230. The sensor 250 may be of any suitable type, such as a Hall effect sensor, a magnetic sensor, a capacitive sensor, an optical sensor, a sonic sensor, etc. In some cases, sensors, such as an accelerometer (e.g., a micro-electro-mechanical system (MEMS) based accelerometer) or any other suitable sensor may be disposed in or on the transfer mechanism assembly 240 to indicate the position of the transfer mechanism assembly 240. In other cases, current and voltages input to and/or measured at the input of the motors 246, 248 may be used to determine the position of the transfer mechanism assembly 240 along the track 238 of the first bridge structure 230. In some cases, a combination of the aforementioned mechanisms, for the purposes of greater precision, accuracy, and/or redundancy, may be used to determine the transfer mechanism assembly 240 position along the track 238 of the first bridge structure 230.

It should be understood that a controller, such as the PC 102, may receive signals from sensors 250, a camera 298, and/or any other suitable detectors and position the first bridge structure 230 at an intended location. This positioning may correspond to the next die 272 that is to be transferred onto the product substrate 210. Additionally, the PC 102 may be configured to position the transfer mechanism assembly 240 along the track 238 of the first bridge structure 230. In particular, the PC 102 may control one or more motors 242, 244, 246, 248 to position the first bridge structure 230 and the transfer mechanism assembly 240. This positioning, as discussed herein, may also be based at least in part on one or more data files, such as data files indicating the locations on the product substrate 210 where die are to be placed and/or data files that indicate die locations and/or known good die on a die substrate 270.

The second bridge structure 260, in an embodiment, may be substantially similar to the first bridge structure 230. The second bridge structure 260 may have a first leg 262, a second leg 264, and a bridge portion 266 disposed between the first leg 262 and the second leg 264. The second bridge structure 260 may be configured to move along the first rail 290 and the second rail 292. The legs 262, 264 may be movably coupled to the rails 290, 292 and may allow the second bridge structure 260 to move along the first rail 290 and second rail 292. Since both the first bridge structure 230 and the second bridge structure 260 are coupled to the same rails 290, 292, the movement of the first bridge structure 230 may be limited by the position of the second bridge structure 260 along the rails 290, 292 and vice versa. The second bridge structure may move along the same direction 282 as the movement direction 252 of the first bridge structure 230. In other words, the movement of both the first bridge structure 230 and the second bridge structure 260 may be along the same direction (e.g., x-direction).

In an embodiment, the movement of the first bridge structure 230 and the second bridge structure 260 may span substantially the full length of the movable stage 202 and/or the product substrate 210. This allows the first bridge structure 230 and the second bridge structure 260 to cooperate with each other to place die 272 on substantially the full surface of the product substrate 210.

The second bridge structure 260 may have a track (obfuscated in this view) disposed along its bridge portion 266. A die substrate frame 268, holding a die substrate 270 with unpackaged die 272 thereon, may be movably mounted on the track of the second bridge structure 260. The track, and therefore, the range of positions of the die substrate 270 may be the same or greater than a width of the product substrate 210 to enable transfer of die 272 onto any suitable location on the product substrate 210. The die substrate 270, as described herein, may be any suitable substrate, such as wafer tape, on which unpackaged die 272 that are to be transferred to the package substrate 210 are held.

The second bridge structure 260 may further include one or more motors 278, 280, 284, 286 to enable the second bridge structure 260 to move along the rails 290, 292 and/or to enable the die substrate 270 to move along the track of the second bridge structure 260. The motor 278 may be encased within the first leg 262, for example within a housing of the first leg 262, and the motor 280 may be encased within the second leg 264. The motors 278, 280 may be computer controlled via PC 102, for example, to exert force on the legs 262, 264 relative to the rails 290, 292 to move the second bridge structure 260 along the rails 290, 292 in the direction 282. In some cases, the direction 282 may be along the same direction 222 along which the movable stage 202 may be configured to move, as well as direction 252 along which the first bridge structure 230 is configured to move.

Although the motors 278, 280 are depicted at disposed in the legs 262, 264, as in the case of the first bridge structure 230, it should be understood that any suitable configuration of the motors 278, 280 relative to the legs 262, 264 may be used to move the second bridge structure 260 along the rails 290, 292. For example, there may be more than one motor 278, 280 per leg 262, 264 of the second bridge structure 260. Additionally, in some cases, the motors 278, 280 may be provided outside of the legs 262, 264 and coupled to the legs 262, 264, such as by wire, cable, pulleys, etc.

The motors 284, 286 may be disposed in and/or on the bridge portion 266 of the second bridge structure 260. The die substrate 270 may be mechanically coupled to the motors 284, 286 by wire, cable, pulleys, etc. (not shown). The motors 278, 280 may be controlled via PC 102, to move the die substrate 270, by way of the die substrate frame 268 on which the die substrate 270 is mounted, along the length of the track of the second bridge structure 260. The second bridge structure 260 may further include one or more sensors 274, depicted here as a linear sensor 274. This sensor 274 may be substantially similar to the sensor 250 and may be configured to provide signals to the PC 102, which signals are indicative of the location of the die substrate frame 268 and the die substrate 270 along the length of the bridge portion 266.

Although the rails 290, 292 are depicted here as a housing with a slot 294, 296 therein, the rails 290, 292 may be of any suitable type. Indeed, any suitable guide, rail, track, or otherwise, may be used for the movement of the first bridge structure 230 and/or the second bridge structure 260. The transfer apparatus 200 may also include the camera 298, as discussed herein. Signals, such as image signals, may be processed by the PC 102 and used, in some cases in conjunction with signals from sensors 250, 274, to control the movement of the bridge structures 230, 260, the transfer mechanism assembly 240, and/or the die substrate 270.

The first bridge structure 230 and the second bridge structure may be moved, under the controller of PC 102, along with the transfer mechanism assembly 240 and the die substrate 270 to bring a die to be transferred 272 in alignment with the pin 276 and a location 220 on the product substrate where the die 272 is to be placed. The PC 102 may perform this alignment by controlling the one or more motors 242, 244, 278, 280, 246, 248, 284, 286 or other suitable electromechanical devices.

It should be understood that under the control of a controller and based at least in part on information about the product substrate 210 and information about the die substrate 270, a die 272 may be aligned with the pin 276 of the transfer mechanism assembly 240 and with the location on the product substrate where the die 272 is to be transferred. When these elements are aligned in two direction (e.g., the x and y directions), the pin 276 may be actuated under the control of the controller (e.g., PC 102) to push the die 272 in a third direction (e.g., the z direction) in contact with the location on the product substrate 210 where the die 272 is to be transferred. The actual occurrence of the transfer may be realized when the adhesive force between the die and the substrate to which the die is to be transferred becomes greater than the adhesive force of retention between the die and the substrate from which the die is being transferred.

It should be understood that the product substrate 210 and, therefore, the stage 202 may be of any suitable size to accommodate the production of current and next generation products. For example, die 272 (e.g., LEDs, micro-sized LEDs, ICs, electrically actuatable elements, etc.) may be attached to relatively small area substrates, such as those used for smart watch PCBs and smart watch displays, or as large as, for example, Gen 10.5 and beyond glass that may be 3.3 meters×2.9 meters in size. Indeed, the transfer apparatus 200 may be scaled in size to be optimized for the products manufactured thereon.

It should be understood that there may be an array of locations where the die 272, the pin 276, and the location 220 on the product substrate 220 could be aligned. Indeed, there are multiple movable elements (e.g., movable stage 202, first bridge structure 230, second bridge structure 260, transfer mechanism assembly 240, die substrate 270, etc.) that may allow for a choice of an area (in the x and y-directions) where the transfer is to take place. This transfer point may be referred to as the alignment point and may be referenced to an initial reference frame, for which corresponding coordinates on a stage reference frame and/or bridge reference frame may be determined. This alignment point, therefore, may be a point in a fixed reference frame to which the product substrate 210, the pin 276, and the die 272 are to be aligned. Since there may be a choice in where the alignment point is located, various algorithms may be used to determine the alignment point for a particular die transfer process. This alignment point may be determined based at least in part on one or more parameters that may be optimized or thresholded, such as misalignment levels and/or transfer time.

Figure 3:
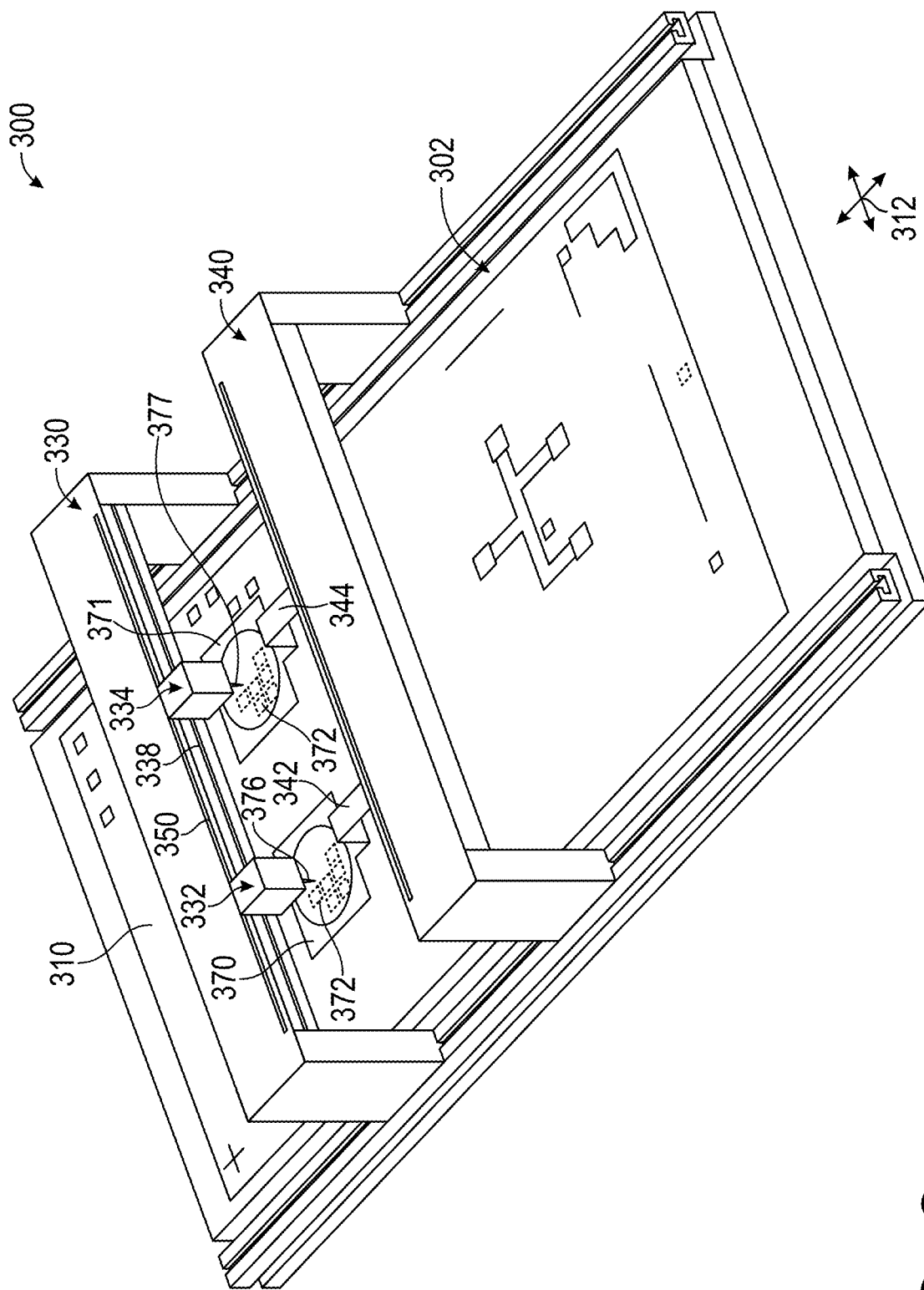
FIG. 3 illustrates a schematic view of an example transfer apparatus with multiple transfer mechanism assemblies on a first bridge and multiple die substrates on a second bridge for transfer of die from the die substrates to a product substrate according to an embodiment of this application.

FIG. 3 illustrates a schematic view of an example transfer apparatus 300 with multiple transfer mechanism assemblies 332, 334 on a first bridge 330 and multiple die substrates 342, 344 on a second bridge 340 for transfer of die 372 from the die substrates 370, 371 to a product substrate 310. Each of the multiple transfer mechanism assemblies 332, 334 include a respective pin 376, 377. The transfer apparatus 300 may be similar to the transfer apparatus 200 of FIG. 2. There may be some features and/or variations between transfer apparatus 300 and transfer apparatus 400 (FIG. 4) that may be implemented in another example embodiment transfer apparatus. In other words, the disclosure herein contemplates any combination of the features discussed in association with transfer apparatus 200 and transfer apparatus 300.

Like transfer apparatus 200, transfer apparatus 300 may include a movable stage 302. As depicted the movable stage 302 may be movable in a first direction and a second direction substantially perpendicular to the first direction (e.g., in an x-direction and y-direction 312). In other words, the movable stage 302 may be controlled via motors and/or other electromechanical devices in two directions. Alternatively, the movable stage 302 may be configured to only move in one direction like movable stage 202 of transfer apparatus 200 of FIG. 2. Regardless of the degrees of freedom of movement of the movable stage 302, product substrate 310, which may be substantially similar to product substrate 210 of FIG. 2, may be supported on movable stage 302.

The transfer apparatus 300 may have a first bridge structure 330 and a second bridge structure 340, the descriptions of which may be substantially similar to the first bridge structure 230 and second bridge structure 260 of FIG. 2, and in the interest of brevity, will not be repeated here. In the interest of more simplified drawings, the motors and certain other elements for moving the first bridge structure 330 and the second bridge structure 340 and elements attached thereto are not depicted, as they are in FIG. 2, but should be understood to be present.

The first bridge structure 330 may movably hold a first transfer mechanism assembly 332 and a second transfer mechanism assembly 334. Similarly, the second bridge structure 340 may movably hold a first die substrate frame 342 and a second die substrate frame 344. Having two transfer mechanism assemblies 332, 334 on the first bridge structure 330 and two die substrate frames 342, 344 may allow for parallel processing (e.g., small movement of components followed by die transfer) of die being transferred on the product substrate 310. In an embodiment, this configuration with multiple transfer mechanism assemblies 332, 334 on the first bridge structure 330 and multiple corresponding die substrate frames 342, 344 on the second bridge structure 340 may allow for die transfer with different types of die. For example, a micro-sized LED of a particular color may be transferred from a first die substrate, while a micro-sized LED of a different color may be transferred from another die substrate.

Figure 4:
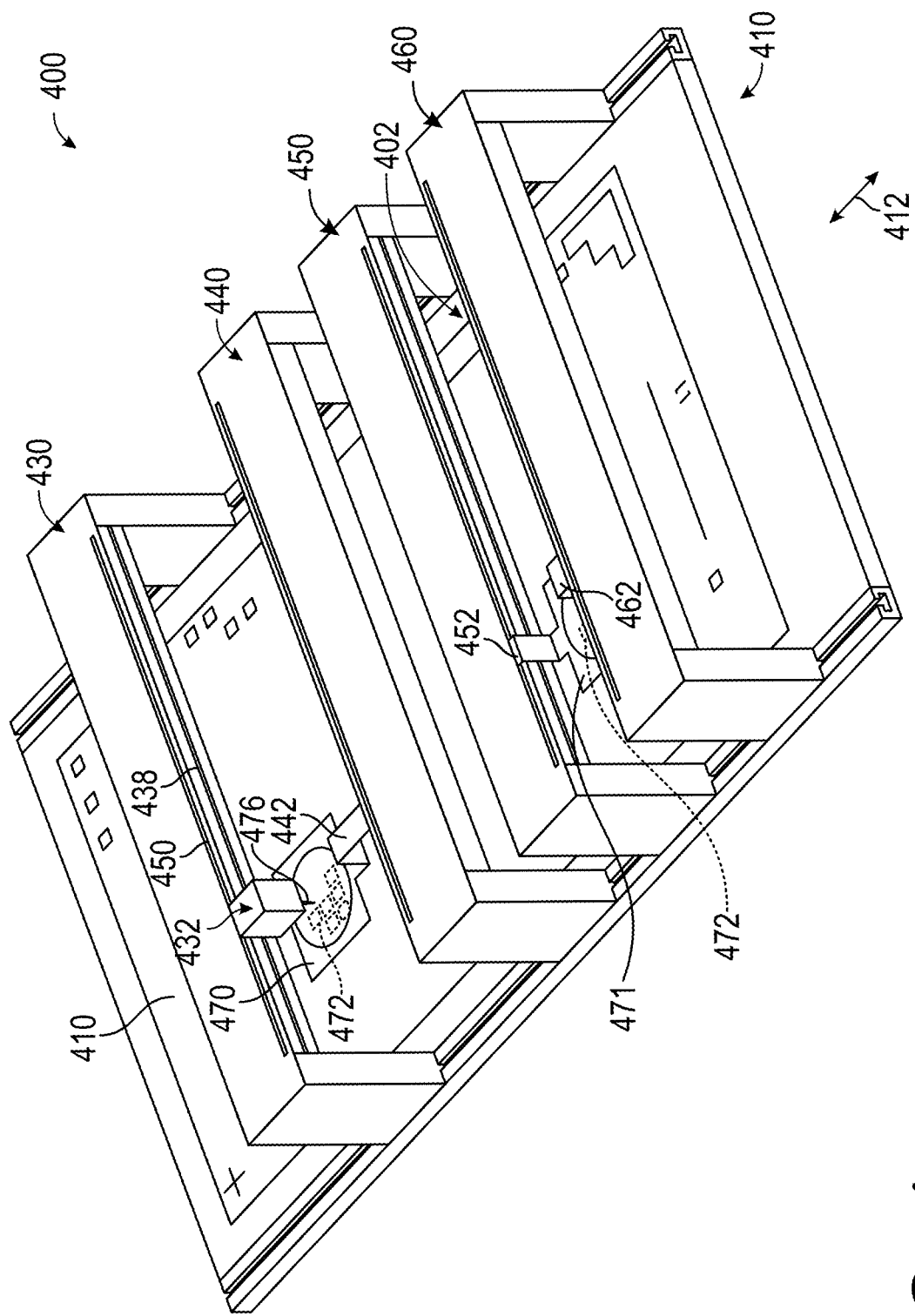
FIG. 4 illustrates a schematic view of an example transfer apparatus with more than two bridge apparatus for transfer of die from a die substrate to a product substrate according to an embodiment of this application.

FIG. 4 illustrates a schematic view of an example transfer apparatus 400 with more than two bridge apparatuses 430, 440, 450, 460 for transfer of die from more than one die substrate frame 442, 452 to a product substrate 410. Like transfer apparatus 200, transfer apparatus 400 may include a movable stage 402 configured to hold the product substrate 410 thereon. The movable stage may be configured to move in a single direction 412, as depicted, or alternatively in two directions (e.g., x-direction and y-direction).

The transfer apparatus 400 may have a first bridge structure 430 and a second bridge structure 440, as well as a third bridge structure 450, and a fourth bridge structure 460, the descriptions of which may be substantially similar to the first bridge structure 230 and second bridge structure 260 of FIG. 2, and in the interest of brevity, will not be repeated here. In the interest of more simplified drawings, the motors and certain other elements for moving the bridge structures 430, 440, 450, 460 and elements attached thereto are not depicted, as they are in FIG. 2, but should be understood to be present.

The first bridge structure 430 may movably hold a first transfer mechanism assembly 432 and the second bridge structure 440 may movably hold a first die substrate frame 442. Similarly, the third bridge structure 450 may movably hold a second die substrate frame 452 and the fourth bridge structure 460 may movably hold a second transfer mechanism assembly 462. Each of the first transfer mechanism assembly 432 and the second transfer mechanism assembly 462 include respective pins 476 (the pin of the first transfer mechanism assembly 432 is obscured by the fourth bridge structure 460. The multiple transfer mechanism assemblies 432, 462 are associated with for transfer of die 472 from the die substrates 470, 471 to the product substrate 410.

The bridge structures 430, 440, 450, 460 may be configured to operate in parallel to increase the throughput of product assembled by the transfer apparatus 400. In an embodiment, this configuration may also enable die diversity by transferring one type of die from one set of bridge structures 430, 440 and transferring another type of die from another set of bridge structures 450, 460. It should additionally be understood that embodiments may include more than two bridge structures, as well as more than one transfer mechanism assembly and/or die substrate movably coupled to one or more of the bridge structures of the transfer apparatus.

Figure 5:
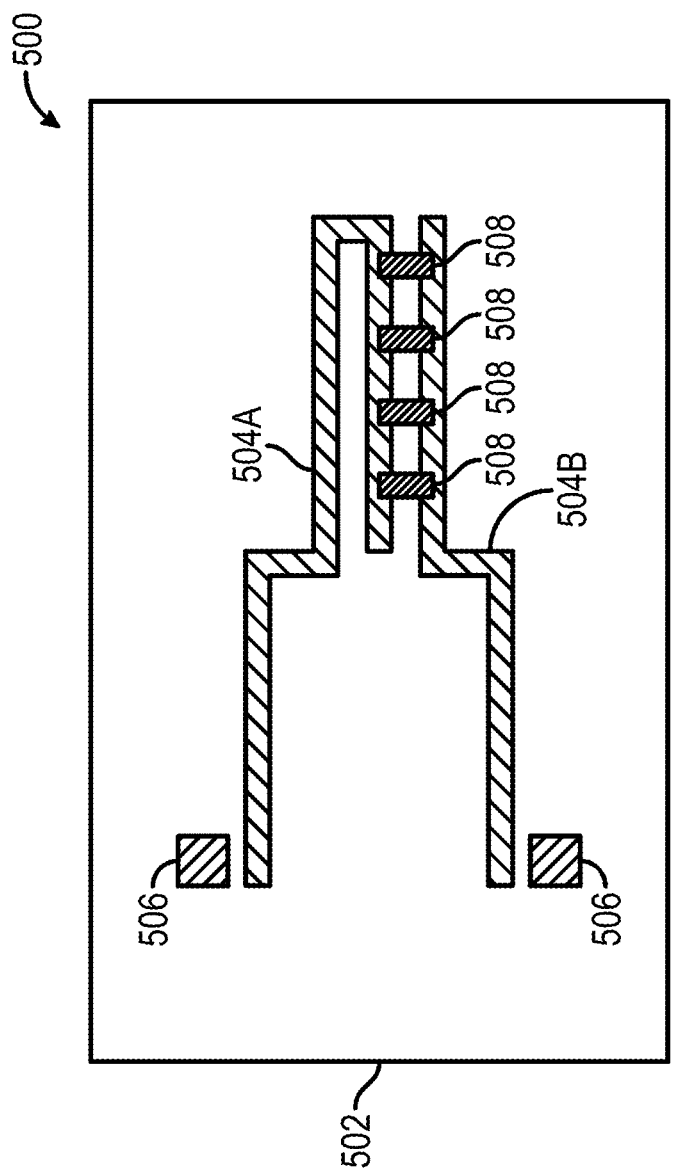
FIG. 5 illustrates a plan view of an embodiment of a product substrate having a circuit trace thereon according to an embodiment of this application.

FIG. 5 illustrates an embodiment of a processed product substrate 500. A product substrate 502 may include a first portion of a circuit trace 504A, which may perform as a negative or positive power terminal when power is applied thereto. A second portion of the circuit trace 504B may extend adjacent to the first portion of the circuit trace 504A, and may act as a corresponding positive or negative power terminal when power is applied thereto.

As similarly described above with respect to the wafer tape, in order to determine where to convey the product substrate 502 to perform the transfer operation, the product substrate 502 may have a bar code (not shown) or other identifier, which is read or otherwise detected. The identifier may provide circuit trace data to the apparatus. The product substrate 502 may further include datum points 506. Datum points 506 may be visual indicators for sensing to locate the first and second portions of the circuit trace 504A, 504B. Once the datum points 506 are sensed, a shape and relative position of the first and second portions of the circuit trace 504A, 504B with respect to the datum points 506 may be determined based on preprogrammed information.

Additionally, die 508 are depicted in FIG. 5 as straddling between the first and second portions of the circuit trace 504A, 504B. In this manner, the electrical contact terminals (not shown) of the die 508 may be bonded to the product substrate 502 during a transfer operation, such as by transfer apparatuses 200, 300, 400. Accordingly, power may be applied to run between the first and second portions of the circuit trace 504A, 504B, and thereby powering die 508. For example, the die may be unpackaged LEDs that were directly transferred from a wafer tape to the circuit trace on the product substrate 502. Thereafter, the product substrate 502 may be processed for completion of the product substrate 502 and used in a circuit or other final product. Further, other components of a circuit may be added by the same or other mechanism of transfer to create a complete circuit, and may include control logic to control LEDs as one or more groups in some static or programmable or adaptable fashion.

Figure 6:
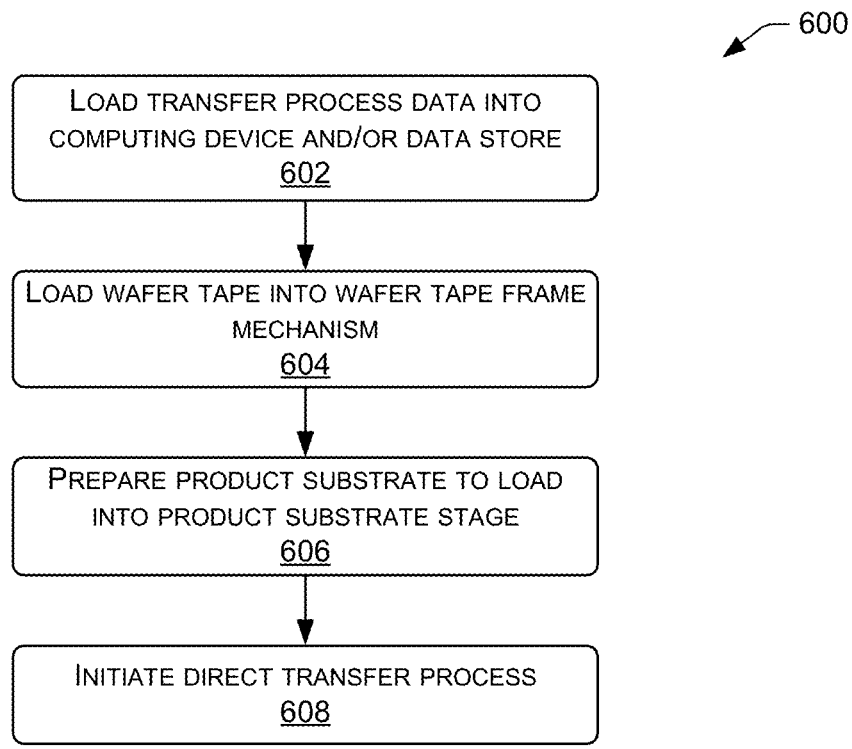
FIG. 6 illustrates a method of a die transfer operation according to an embodiment of this application.

A method 600 of executing a direct transfer process, in which one or more die is directly transferred from a die substrate, such as wafer tape, to a product substrate, is illustrated in FIG. 6. The processes of the method 600 described herein may not be in any particular order and as such may be executed in any satisfactory order to achieve a desired product state. The method 600 may include a step 602 of loading transfer process data into a PC 102 and/or a data store. The transfer process data may include data such as die map data, circuit CAD files data, and/or needle profile data.

An operation of loading a wafer tape onto a wafer tape frame mechanism 604 may also be included in method 600. Loading the wafer tape into the wafer tape frame, such as die substrate frames 268, 342, 344, 442, 452, may include controlling the die frame to move to a load position. In other embodiments, loading the wafer tape into the wafer tape frame may not require moving the wafer tape frame to a load position. The wafer tape, such as die substrate 270, may be secured in the wafer tape frame mechanism in the load position. The wafer tape may be loaded so that the die of the semiconductor, such as die 272, are facing downward toward the product substrate conveyor mechanism.

The method 600 may further include a step 606 of preparing the product substrate to load into the product substrate stage. Preparing the product substrate may include a step of screen printing a circuit trace on the product substrate according to the pattern of the CAD files being loaded into the PC or data store. Additionally, datum points may be printed onto the circuit substrate in order to assist in the transfer process. The product substrate stage, such as stage 202, may be controlled to move to a load position, whereat the product substrate, such as product substrate 210, may be loaded into the product substrate stage. The product substrate may be loaded so that the circuit trace faces toward the die on the wafer. In an embodiment, for example, the product substrate may be delivered and placed in the load position by a conveyor (not shown) or other automated mechanism, such as in the style of an assembly line. Alternatively, the product substrate may be manually loaded by an operator.

Once the product substrate is properly loaded onto the movable stage and the wafer tape is properly loaded into the wafer tape frame, a program to control the direct transfer of the die from the wafer tape to the circuit trace of the product substrate may be executed via the PC 102 to initiate the direct transfer operation 608. The details of the direct transfer operation are described herein.

Figure 7:
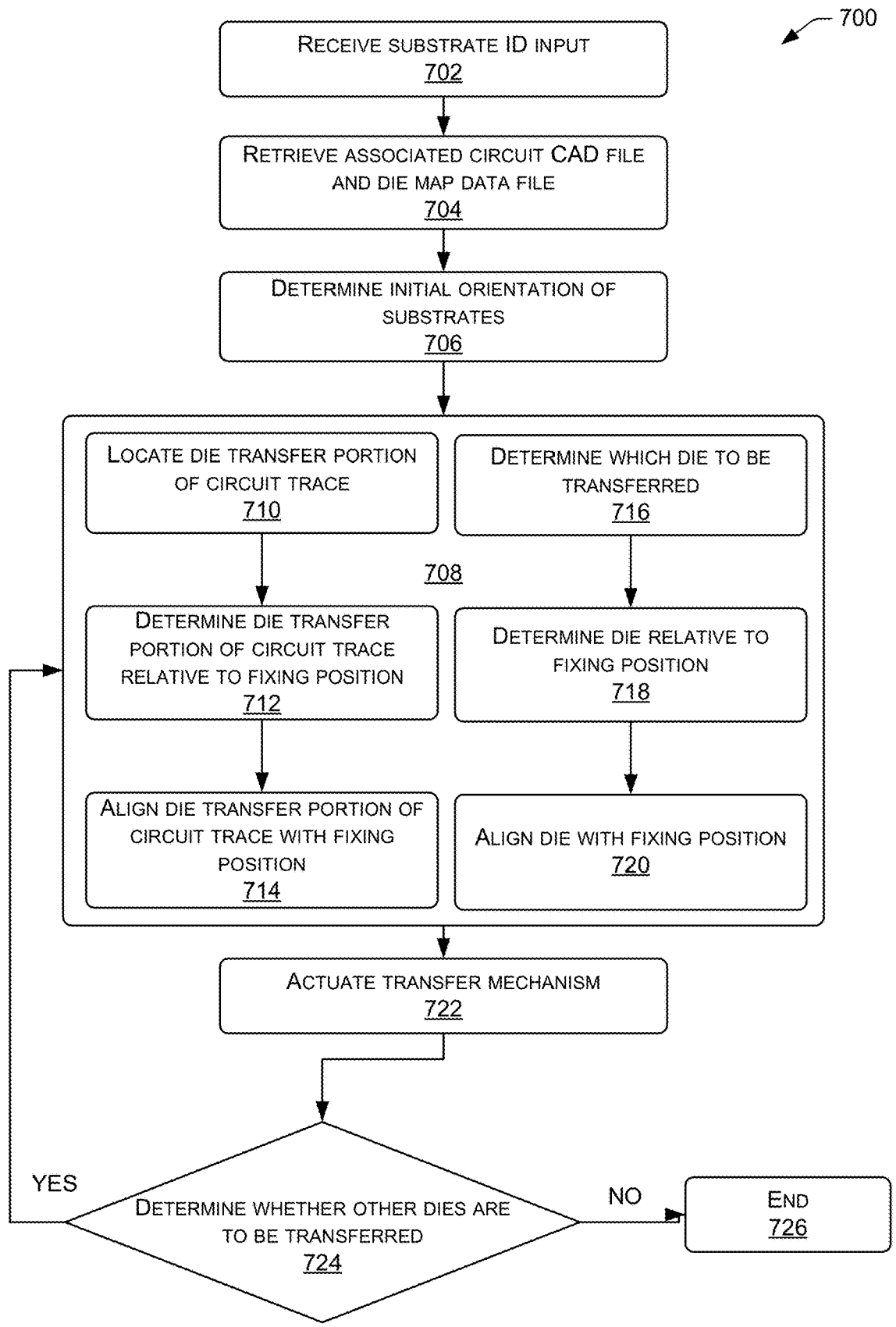
FIG. 7 illustrates a method of a die transfer operation according to an embodiment of this application.

A method 700 of the direct transfer operation of causing die to be transferred directly from the wafer tape (or other substrate holding die, also called a "die substrate" for simplified description of FIG. 7) to the product substrate is illustrated in FIG. 7. The operations of the method 700 described herein may not be in any particular order and as such may be executed in any satisfactory order to achieve a desired product state.

In order to determine which die to place on the product substrate and where to place the die on the product substrate, the PC 102 may receive input regarding the identification of the product substrate and the identification of the die substrate containing the die to be transferred 702. This input may be entered manually by a user, or the PC 102 may send a request to the cell managers in control, respectively, of the product substrate alignment sensor and the die detector. The request may instruct the sensor to scan the loaded substrate for an identification marker, such as a barcode or QR code;

and/or the request may instruct the detector to scan the loaded die substrate for an identification marker, such as a barcode or QR code.

Using the product substrate identification input, the PC 102 may query the data store or other memory to match the respective identification markers of the product substrate and the die substrate and retrieve the associated data files 704. In particular, the PC 102 may retrieve a circuit CAD file associated with the product substrate that describes the pattern of the circuit trace on the product substrate. The circuit CAD file may further contain data such as the number of, relative positions of, and respective quality requirement of, the die to be transferred to the circuit trace. Likewise, the PC may retrieve a die map data file associated with the die substrate that provides a map of the relative locations of the specific die on the die substrate.

In the process of executing a transfer of a die to the product substrate, the PC 102 may determine the initial orientation of the product substrate and the die substrate relative to the transfer mechanism and the fixing mechanism 706. Within process 706, the PC 102 may instruct the substrate alignment sensor to locate datum points on the product substrate. As discussed above, the datum points may be used as reference markers for determining the relative location and orientation of the circuit trace on the product substrate. Further, the PC 102 may instruct the die detector to locate one or more reference points on the die substrate to determine the outlay of the die.

Once the initial orientation of the product substrate and die substrate are determined, the PC 102 may instruct the respective product substrate and die substrate conveyance mechanisms to orient the product substrate and die substrate, respectively, into a position of alignment with the transfer mechanism and the fixing mechanism 708.

The alignment step 708 may include determining the location of the portion of the circuit trace to which a die is to be transferred 710, and where the portion is located relative to the transfer fixing position 712. The transfer fixing position may be considered to be the point of alignment between the transfer mechanism and the product substrate. Based on the data determined in steps 710 and 712, the PC 102 may instruct the product substrate conveyance mechanism to convey the product substrate so as to align the portion of the circuit trace to which a die is to be transferred with the transfer fixing position 714.

The alignment step 708 may further include determining which die on the die substrate will be transferred 716, and where the die is located relative to the transfer fixing position 718. Based on the data determined in steps 716 and 718, the PC 102 may instruct the wafer tape conveyance mechanism to convey the die substrate so as to align the die to be transferred with the transfer fixing position 720.

Once the die to be transferred from the die substrate and the portion of the circuit trace to which a die is to be transferred are aligned with the transfer mechanism, the needle may be actuated 722 to effectuate the transfer of the die from the die substrate to the product substrate.

After a die is transferred, the PC 102 may determine whether additional die are to be transferred 724. In the case where another die is to be transferred, the PC may revert to step 708 and realign the product and die substrates accordingly for a subsequent transfer operation. In the case where there will not be another die transferred, the transfer process is ended 726.

Figure 8:
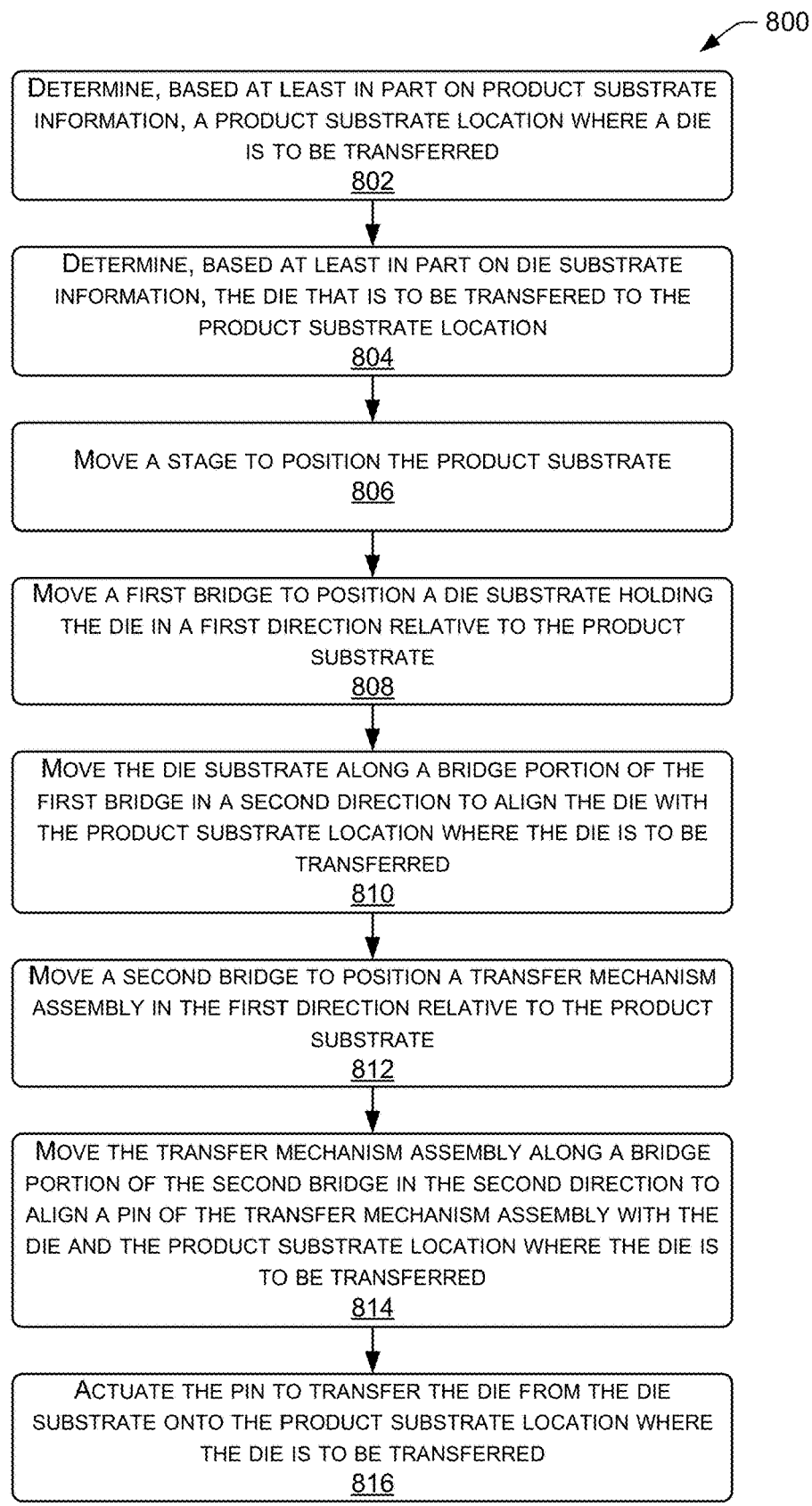
FIG. 8 illustrates a method of a die transfer process from a die substrate held by a first bridge and a transfer mechanism assembly held by a second bridge, according to an embodiment of this application.

FIG. 8 illustrates a method 800 of a die transfer process from a die substrate held by a first bridge and a transfer mechanism assembly held by a second bridge, according to an embodiment of this application. Method 800 may be performed by any suitable controller of the transfer apparatus 200, 300, 400, such as PC 102.

At block 802, a product substrate location where a die is to be transferred may be determined based at least in part on product substrate information. In an embodiment, the locations for die attachment may be indicated in a data file corresponding to the product substrate information. For example, coordinates on the product substrate may be indicated where the die are to be transferred on to the product substrate. Additionally, or alternatively, image data, such as from a video camera or other image sensor may indicate visible and/or optical indicia (e.g., an orange line) where a die is to be transferred.

At block 804, the die that is to be transferred to the product substrate location may be determined based at least in part on die substrate information. The die substrate information may be in a die substrate information data file that provides a map and/or otherwise indicates coordinates on the die substrate where the die are located. Additionally, in an embodiment, the die substrate information may include an indication of known good die, or at least suspected good die, on the die substrate. This way, known bad die or suspected bad die can be avoided from being transferred on to the product substrate. In some cases, the next die to be transferred may be selected as the next good die on the die substrate as proceeding in a rastered progression.

At block 806, the product substrate may be positioned by moving a movable stage. The location on the product substrate where the die is to be attached may be moved to a particular alignment position where the die to be attached and the pin of the transfer mechanism assembly may be moved. In some cases, the product substrate may only be moved in a single direction (e.g., x-direction), and in other cases, the product substrate may be moved in two directions (e.g., x-direction and y-direction). In some further cases, the product substrate on the movable stage may not be moved at all. As discussed herein, movement of the stage may be by way of one or more motors or other electromechanical components controlled by a controller of the transfer apparatus. In an embodiment, the positioning of the stage, and thereby the determination of an alignment location where the die transfer is performed, may be based at least in part on optimizing one or more parameters and/or by requiring one or more parameters to meet certain criteria. For example, the alignment point may be selected in a manner that optimizes expected transfer accuracy and/or expected transfer time.

At block 808, a first bridge may be moved to position a die substrate holding the die in a first direction relative to the product substrate. This movement may be performed by controlling one or more motors or other electromechanical devices configured to move the first bridge along a pair of rails. At block 810, the die substrate may be moved along a bridge portion of the first bridge in a second direction to align the die with the product substrate location where the die is to be transferred. This movement may be performed by controlling one or more motors or other electromechanical devices configured to move the die substrate frame or holder along track of the first bridge.

At block 812, a second bridge may be moved to position a transfer mechanism assembly in the first direction relative to the product substrate. In an embodiment, this may entail controlling one or more motors or other electromechanical components to move the second bridge to a designated position corresponding to aligning the die with the transfer mechanism assembly with the location on the product substrate where the die is to be attached. At block 814, the transfer mechanism assembly may be moved along a bridge portion of the second bridge to align a pin of the transfer mechanism assembly with the die and the product substrate location where the die is to be attached. This movement may be performed by controlling one or more motors or other electromechanical devices configured to move the die substrate frame or holder along track of the first bridge. At block 816, the pin may be actuated to transfer the die from the die substrate onto the product substrate location where the die is to be attached. This pin may push the die into a position to transfer onto the product substrate.

Figure 9:
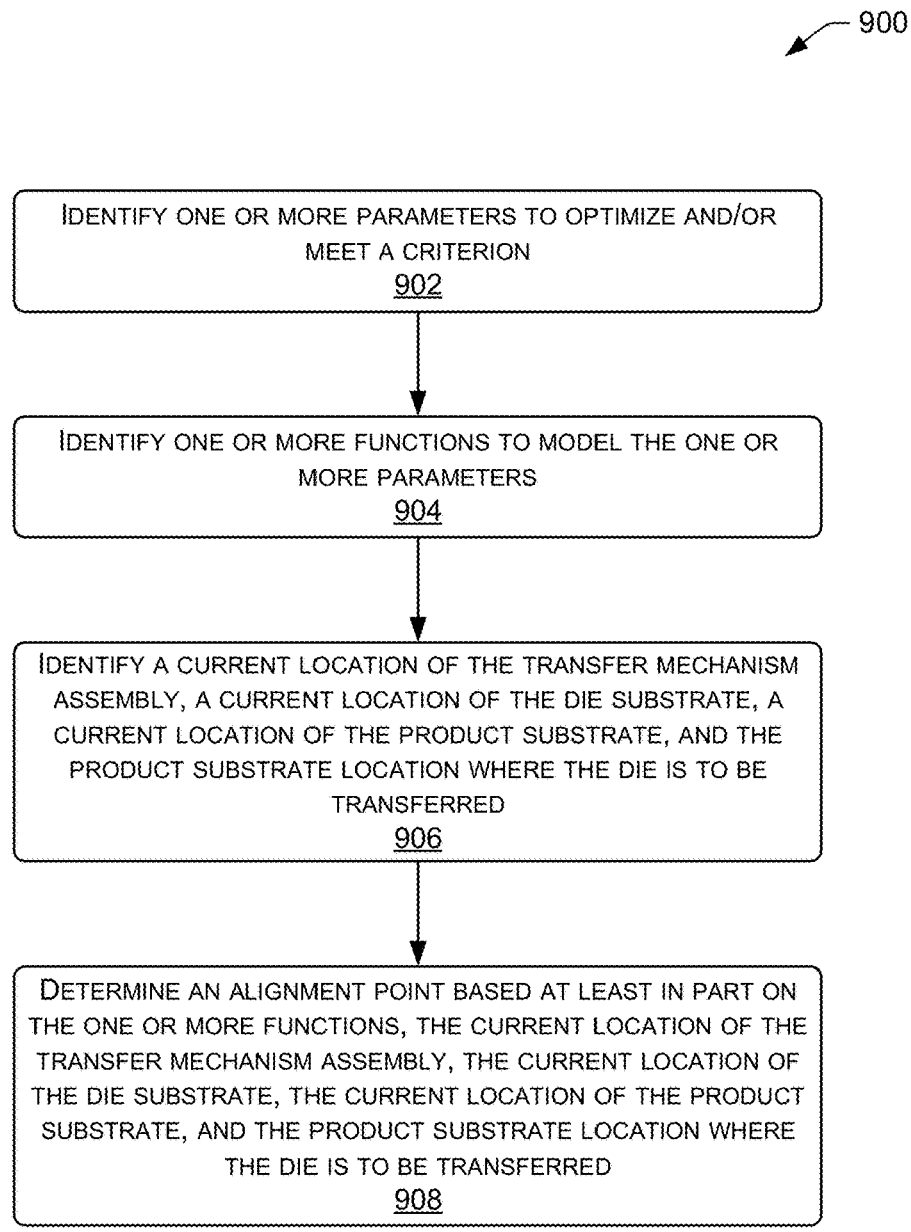
FIG. 9 illustrates a method to determine a location for a die transfer process based at least in part on one or more parameter criteria and/or optimization, according to an embodiment of this application.

FIG. 9 illustrates a method 900 to determine a location for a die transfer process based at least in part on one or more parameter criteria and/or optimization, according to an embodiment of this application. Method 900 may be performed by any suitable controller of the transfer apparatus 200, 300, 400, such as PC 102.

At block 902, one or more parameters to optimize and/or meet a criterion may be identified. For example, parameters and criterion may include expected alignment accuracy and/or expected transfer time. In some transfer situations, one parameter may be optimized, while in other transfer situations, multiple parameters may be optimized. For example, parameters of a combined metric (e.g., minimize the function f(transfer_time [in seconds], misalignment [in microns])=2*transfer_time+misalignment) may be optimized. In yet other transfer situations, one or more parameters may be compared to a threshold (e.g., transfer time<0.7 seconds, and misalignment<15 microns) to determine if a criterion is met. In still other transfer situations, one parameter may be compared to a threshold to meet an acceptable value for that parameter while one or more other parameters may be optimized (e.g., minimize misalignment without letting transfer time exceed 300 msec).

At block 904, one or more functions may be identified to model the one or more parameters. These functions may be of any suitable type. For example, the one or more functions may be empirically developed by using measurement data. One example of an empirically developed function may be a function that models the misalignment of a die as a function of how much a transfer mechanism assembly moves and/or a die substrate frame moves in the x-direction and the y-direction from an initial position to a die transfer position. Another example may be a fitted model of empirical data about the time it takes to perform a die transfer as a function of the distance traveled by the transfer assembly mechanism and/or the die substrate frame. At block 906, a current location of the transfer mechanism assembly, a current location of the die substrate, a current location of the product substrate, and the product substrate location where the die is to be transferred may be identified.

At block 908, an alignment point may be determined based at least in part on the one or more functions, the current location of the transfer mechanism assembly, the current location of the die substrate, the current location of the product substrate, and the product substrate location where the die is to be transferred. The alignment point may be referenced to an initial reference frame, for which corresponding coordinates on a stage reference frame and/or bridge reference frame may be determined. This alignment point, therefore, may be a point in a fixed reference frame to which the product substrate, the pin of the transfer assembly mechanism, and the die to be transferred are to be aligned. In an embodiment, the alignment point may be determined by optimizing the movement of the transfer mechanism assembly and/or the die substrate frame to minimize expected misalignment and/or transfer time according to the functions as identified by the operations of block 904.

CONCLUSION

Although several embodiments have been described in language specific to structural features and/or methodological acts, it is to be understood that the claims are not necessarily limited to the specific features or acts described. Rather, the specific features and acts are disclosed as illustrative forms of implementing the claimed subject matter. Furthermore, the use of the term "may" herein is used to indicate the possibility of certain features being used in one or more various embodiments, but not necessarily in all embodiments.

What is claimed is:

1. An apparatus for transferring a semiconductor die from a first substrate to a second substrate, the apparatus comprising:
    a first rail extending along a first direction;
    a second rail extending along the first direction;
    a first bridge structure movably mounted to the first rail and the second rail so as to be movable along the first direction, the first bridge structure including a first track extending along a second direction that is substantially perpendicular to the first direction;
    a transfer mechanism assembly including a needle, the transfer mechanism assembly being movably mounted to the first track of the first bridge structure to move along the second direction;
    a second bridge structure movably mounted to the first rail and the second rail so as to be movable along the first direction, the second bridge structure including a second track extending along the second direction;
    a die substrate holder to secure the first substrate, the die substrate holder being movably mounted to the second track of the second bridge structure to move along the second direction; and
    a controller to:
        actuate at least one motor mechanically coupled to the first bridge structure, the second bridge structure, the transfer mechanism assembly, and the die substrate holder;
        control movements of the first bridge structure, the second bridge structure, the transfer mechanism assembly, and the die substrate holder via actuation of the at least one motor to align the semiconductor die on the first substrate with the needle of the transfer mechanism assembly with a transfer position on the second substrate where the semiconductor die is to be transferred, and
        actuate a pin actuator mechanically coupled to the needle to push the semiconductor die into the transfer position on the second substrate.

2. The apparatus for transferring the semiconductor die from the first substrate to the second substrate according to claim 1, further comprising a movable stage to support the second substrate, the movable stage to move the second substrate along at least one of the first direction or the second direction,
    wherein the movable stage is disposed between the first rail and the second rail, and
    wherein the controller controls movement of the movable stage.

3. The apparatus for transferring the semiconductor die from the first substrate to the second substrate according to claim 2, wherein the controller further determines a point of alignment coinciding with the transfer position on the second substrate, the point of alignment to be determined based at least in part on one or more of: (i) a predicted time to transfer the semiconductor die on a product substrate; or (ii) a predicted placement accuracy of the semiconductor die on the product substrate.

4. The apparatus for transferring the semiconductor die from the first substrate to the second substrate according to claim 1, further comprising an optical sensor positioned to sense a location of the semiconductor die on the first substrate with respect to the transfer position on the second substrate.

5. The apparatus for transferring the semiconductor die from the first substrate to the second substrate according to claim 1, wherein the at least one motor includes:
   a first motor to move the first bridge structure along the first rail and the second rail;
   a second motor to move the second bridge structure along the first rail and the second rail;
   a third motor to move the transfer mechanism assembly along the first track of the first bridge structure; and
   a fourth motor to move the die substrate holder along the second track of the second bridge structure,
   wherein the controller is communicatively coupled to the first motor to move the first bridge in the first direction, the second motor to move the second bridge in the first direction, the third motor to move the transfer mechanism assembly in the second direction, and the fourth motor to move the die substrate in the second direction, to align the semiconductor die on the first substrate with the needle of the transfer mechanism assembly with the transfer position on the second substrate.

6. The apparatus for transferring the semiconductor die from the first substrate to the second substrate according to claim 1, further comprising a first sensor to provide the controller an indication of where the transfer mechanism assembly is located along the second track of the second bridge structure.

7. The apparatus for transferring the semiconductor die from the first substrate to the second substrate according to claim 1,
   wherein the transfer position is a first transfer position, and
   wherein the apparatus further comprises:
      a second transfer mechanism assembly including the needle and being movably mounted on the first track of the first bridge structure; and
      a second die substrate holder to secure a third substrate having at least a second semiconductor die thereon, the second die substrate holder being movably mounted on the second track of the second bridge structure, and
   wherein the controller further:
      controls movements of the second transfer mechanism assembly in the second direction and the second die substrate holder in the second direction to align a second semiconductor die on the third substrate and the needle of the second transfer mechanism assembly with a second transfer position on the second substrate where the second semiconductor die is to be transferred, and actuate the needle of the second transfer mechanism to push the second semiconductor die into the second transfer position on the second substrate.

8. The apparatus for transferring the semiconductor die from the first substrate to the second substrate according to claim 1, further comprising:
   a third bridge structure movably mounted to the first rail and the second rail, the third bridge structure being moveable along the first direction, the third bridge structure including a third track extending in the second direction;
   a second transfer mechanism assembly having the needle and being movably mounted on the third track of the third bridge structure to move along the second direction;
   a fourth bridge structure movably mounted to the first rail and the second rail, the fourth bridge structure being moveable along the first direction, the fourth bridge structure including a fourth track extending in the second direction; and
   a second die substrate holder to secure a third substrate having at least a second semiconductor die thereon, the second die substrate holder being movably mounted on the fourth track of the fourth bridge structure to move along the second direction,
   wherein the controller further:
      controls movements of the third bridge, the fourth bridge, the second transfer mechanism assembly, and the second die substrate holder to align the second semiconductor die and the needle of the second transfer mechanism assembly with a second transfer position on the second substrate where the second semiconductor die is to be transferred, and
      the needle of the second transfer mechanism assembly to push the second semiconductor die into the second transfer position on the second substrate.

* * * * *